United States Patent
Goto

(10) Patent No.: US 6,813,513 B2
(45) Date of Patent: Nov. 2, 2004

(54) METHOD FOR MEASUREMENT OF MAGNETIC FIELDS, METHOD FOR PRODUCTION OF GRADIENT COILS, GRADIENT COIL, AND APPARATUS FOR MAGNETIC RESONANCE IMAGING

(75) Inventor: Takao Goto, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 582 days.

(21) Appl. No.: 09/827,037

(22) Filed: Apr. 5, 2001

(65) Prior Publication Data

US 2001/0041819 A1 Nov. 15, 2001

(30) Foreign Application Priority Data

Apr. 19, 2000 (JP) ........................................ 2000-117880

(51) Int. Cl.[7] ............................. A61B 5/05; G01V 3/00
(52) U.S. Cl. ........................................ 600/422; 324/307
(58) Field of Search ................................ 600/422, 420, 600/431, 433, 435, 436, 423; 250/302; 424/9.3; 324/318, 306, 307, 308, 309

(56) References Cited

U.S. PATENT DOCUMENTS

| 4,723,116 A | * | 2/1988 | Muller et al. ................ 335/296 |
| 4,983,922 A | * | 1/1991 | Tahara ......................... 324/320 |
| 5,313,164 A | * | 5/1994 | Starewicz et al. ........... 324/318 |
| 5,373,239 A | * | 12/1994 | Marek et al. ................ 324/320 |
| 6,437,672 B1 | * | 8/2002 | Takeshima et al. ......... 335/216 |

* cited by examiner

Primary Examiner—Daniel Robinson
(74) Attorney, Agent, or Firm—Moonray Kojima

(57) ABSTRACT

For the purpose of realizing a method for measuring, after stopping application of a gradient magnetic field, the residual magnetic field and a method for manufacturing a gradient coil by causing the characteristics of the residual magnetic fields, revealed by the measurement, to be reflected in it, a magnetically resonant sample is arranged at a measuring point on the surface of an imaginary sphere in a measuring space; a gradient magnetic field is applied to the measuring space; RF excitation is carried out after stopping the application of the gradient magnetic field to measure FID signals generated by the sample; the magnetic field intensity is calculated on the basis of a difference in differentials of the phases of the FID signals; and a magnetic field intensity is fitted into a spheric surface function.

11 Claims, 11 Drawing Sheets

METHOD FOR MEASUREMENT OF MAGNETIC FIELDS, METHOD FOR PRODUCTION OF GRADIENT COILS, GRADIENT COIL, AND APPARATUS FOR MAGNETIC RESONANCE IMAGING

BACKGROUND OF THE INVENTION

The present invention relates to a method for measurement of magnetic fields, a method for production of gradient coils, a gradient coil and an apparatus for magnetic resonance imaging, and more particularly to a method for measuring, after stopping application of a gradient magnetic field, the residual magnetic field; a gradient coil whose higher term of residual magnetic field is smaller; a manufacturing method for the same; and an apparatus for magnetic resonance imaging having such a gradient coil.

In a magnetic resonance imaging (MRI) apparatus, a subject of imaging is brought into the bore of a magnet system, i.e. a space in which a magnetostatic field is formed, to generate magnetic resonance signals in the subject by applying gradient magnetic fields and high frequency magnetic fields, and sectional images are generated (reconstructed) on the basis of received magnetic resonance signals.

In a magnet system which uses permanent magnets for generating a magnetostatic field, a pole piece for uniformizing the magnetic flux distribution in the magnetostatic field space is provided at the tip of each of paired permanent magnets opposite to each other, and a gradient coil for generating gradient magnetic fields is provided along the pole face of each such pole piece.

In the magnet system described above, as each gradient coil is close to a pole piece, the pole piece is magnetized by the gradient magnetic field, and the phase of the spin is affected by a magnetic field formed by its residual magnetization as if there were an eddy current having an extremely long time constant. As a result, imaging that calls for precise phase control, such as that by a fast spin echo (FSE) method is disturbed.

So far, because of the absence of an appropriate method to measure magnetic fields attributable to residual magnetization, it has been impossible to work out a way to eliminate its impact.

SUMMARY OF THE INVENTION

Therefore, an object of the present invention is to realize a method for measuring, after stopping application of gradient magnetic fields, the residual magnetic fields; a method for manufacturing a gradient coil by causing the characteristics of the residual magnetic fields, revealed by the measurement, to be reflected in it; a gradient coil manufactured by that method; and an apparatus for magnetic resonance imaging having such a gradient coil.

(1) In order to solve the above-noted problem, the invention from one point of view is a method for measurement of magnetic fields characterized in that a magnetically resonant sample is arranged at a measuring point on the surface of an imaginary sphere in a measuring space; a gradient magnetic field is applied to the measuring space; RF excitation is carried out after stopping the application of the gradient magnetic field to measure FID signals generated by the sample; the magnetic field intensity is calculated on the basis of a difference in differentials of the phases of the FID signals; and a magnetic field intensity is fitted into a spheric surface function representing a magnetic field intensity distribution in the measuring space.

According to the invention from this point of view, a spheric surface function representing the characteristics of the residual magnetic field is identified by measuring the magnetic field in which residual magnetization arises by utilizing FID signals from a sample arranged at a measuring point on a spheric surface and fitting the measurement into the spheric surface function.

(2) In order to solve the above-noted problem, the invention from another point of view is a method for measurement of magnetic fields characterized in that a magnetically resonant sample is arranged at a measuring point on the surface of an imaginary sphere in a measuring space; another magnetically resonant sample is arranged at the center of the sphere; a gradient magnetic field is applied to the measuring space; RF excitation is carried out after stopping the application of the gradient magnetic field to measure FID signals generated by the samples; a magnetic field intensity at the measuring point is calculated on the basis of a difference in differentials of the phases of FID signals generated by the samples at the measuring point and at the center of the sphere; and the magnetic field intensity is fitted into a spheric surface function representing a magnetic field intensity distribution in the measuring space.

According to the invention from this point of view, FID signals from a sample arranged at the center of the sphere are measured and used as reference.

(3) In order to solve the above-noted problem, the invention from still another point of view is a method for measurement of magnetic fields characterized in that: a magnetically resonant sample is arranged at a measuring point on the surface of an imaginary sphere in a measuring space; a gradient magnetic field is intermittently applied while the gradient is successively varied from the maximum gradient in one polarity to the maximum gradient in the reverse polarity and then the gradient is successively varied from the maximum gradient in the reverse polarity to the maximum gradient in the first polarity; RF excitation is carried out during the intermittence of the gradient magnetic field to measure FID signals generated by the sample; differentials of the phases of the FID signals are calculated; a magnetic field intensity at the measuring point is calculated on the basis of the hysteresis of differences in the differentials accompanying the completion of the round of gradients; and the magnetic field intensity is fitted into a spheric surface function representing a magnetic field intensity distribution in the measuring space.

According to the invention from this point of view, the gradient magnetic field is varied reciprocatingly between the maximum gradient in one polarity and the maximum gradient in the reverse polarity. This makes possible magnetic field measurement with the hysteresis of residual magnetization kept constant.

(4) In order to solve the above-noted problem, the invention from still another point of view is a method for measurement of magnetic fields characterized in that: a magnetically resonant sample is arranged at a measuring point on the surface of an imaginary sphere in a measuring space; another magnetically resonant sample is arranged at the center of the sphere; a gradient magnetic field is intermittently applied while the gradient is successively varied from the maximum gradient in one polarity to the maximum gradient in the reverse polarity and then the gradient is successively varied from the maximum gradient in the reverse polarity to the maximum gradient in the first polarity; RF excitation is carried out during the intermittence of the gradient magnetic field to measure FID signals generated by the samples; differences in differentials of the phases of FID signals generated by the samples at the measuring point and at the center of the sphere are calculated; a magnetic field intensity at the measuring point is calculated on the basis of the hysteresis of the differences in the differentials accompanying the completion of the round of gradients; and the magnetic field intensity is fitted into a spheric surface function representing a magnetic field intensity distribution in the measuring space.

According to the invention from this point of view, FID signals from a sample arranged at the center of the sphere are measured and used as reference.

(5) In order to solve the above-noted problem, the invention from still another point of view is the method for measurement of magnetic fields, according to any of (1) through (4), characterized in that: the measurement is consecutively accomplished at a plurality of measuring points.

According to the invention from this point of view, the same sample can be used repeatedly because measurement is done consecutively at a plurality of measuring points.

(6) In order to solve the above-noted problem, the invention from still another point of view is a method for production of gradient coils characterized in that, in producing a gradient coil: a magnetic field to be generated by the gradient coil on the surface of an imaginary sphere in a space is calculated; the magnetic field is fitted into a spheric surface function; and the current pass of the coil is determined so as to keep small, out of high order terms in the spheric surface function into which the fitting has been carried out, a high order term corresponding to the highest order term in the spheric surface function representing the magnetic field measured by a method according to any of (1) through (5).

According to the invention from this point of view, a gradient coil which generates less affecting residual magnetization can be produced because the current pass of the gradient coil is determined so as to keep small a high order term corresponding to the highest order term of the residual magnetic field revealed by measurement.

(7) In order to solve the above-noted problem, the invention from still another point of view is a gradient coil for generating a gradient magnetic field with a current flowing through a current pass, the gradient coil being characterized in that, the current pass is determined by the following procedure:

(a) a magnetic field to be generated by the gradient coil on the surface of an imaginary sphere in a space is calculated;

(b) the magnetic field is fitted into a spheric surface function; and (c) the current pass of the coil is determined so as to keep small, out of high order terms in the spheric surface function into which the fitting has been carried out, a high order term corresponding to the highest order term in the spheric surface function representing the magnetic field measured by a method according to any one of (1) through (5).

The invention from this point of view results in a gradient coil which generates less affecting residual magnetization can be produced because the current pass of the gradient coil is determined so as to keep small a high order term corresponding to the highest order term of the residual magnetic field revealed by measurement.

(8) In order to solve the above-noted problem, the invention from still another point of view is an apparatus for magnetic resonance imaging for structuring an image on the basis of magnetic resonance signals acquired by using a magnetostatic field, gradient magnetic fields and high frequency magnetic fields, the apparatus for magnetic resonance imaging being characterized in that, it is provided with, as a gradient coil for generating the gradient magnetic field, a gradient coil having a current pass determined by the following procedure:

(a) a magnetic field to be generated by the gradient coil on the surface of an imaginary sphere in a space is calculated;

(b) the magnetic field is fitted into a spheric surface function; and (c) the current pass of the coil is determined so as to keep small, out of high order terms in the spheric surface function into which the fitting has been carried out, a high order term corresponding to the highest order term in the spheric surface function representing the magnetic field measured by a method according to any one of (1) through (5).

According to the invention from this point of view, appropriate magnetic resonance imaging can be accomplished using a gradient coil which generates less affecting residual magnetization because the current pass of the gradient coil is determined so as to keep small a high order term corresponding to the highest order term of the residual magnetic field revealed by measurement.

Therefore, the present invention makes it possible to realize a method for measuring, after stopping application of gradient magnetic fields, the residual magnetic fields; a method for manufacturing gradient coils reflecting the characteristics of residual magnetic fields revealed by the measurement; a gradient coil manufactured by the method; and an apparatus for magnetic resonance imaging having such gradient coils.

Further objects and advantages of the present invention will be apparent from the following description of the preferred embodiments of the invention as illustrated in the accompanying drawings.

DETAILED DESCRIPTION OF THE INVENTION

Figure 1:
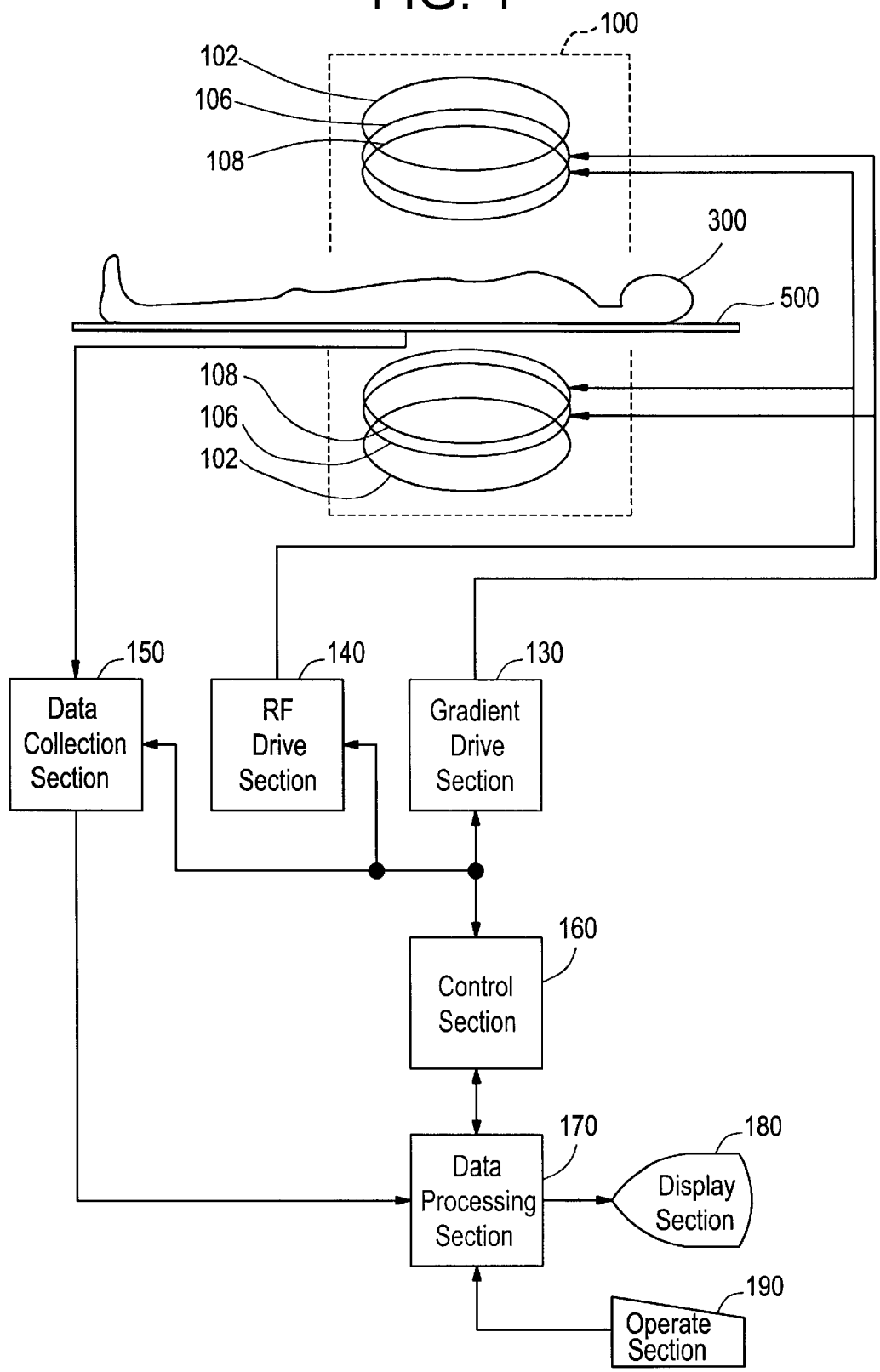
FIG. 1 is a block diagram illustrating an apparatus in one mode of implementing the present invention.

A mode of carrying out the present invention will be described in detail below with reference to drawings. FIG. 1 is a block diagram illustrating an apparatus for magnetic resonance imaging. This apparatus is an example of mode of implementing the invention. The configuration of this apparatus presents an example of mode of implementing the invention regarding the apparatus. The operation of this apparatus illustrates an example of mode of implementing the invention regarding the method.

As illustrated in FIG. 1, this apparatus has a magnet system 100. The magnet system 100 has main magnetic field magnet sections 102, gradient coil sections 106 and radio frequency (RF) coil sections 108. These main magnetic field magnet sections 102 and coil sections are paired opposite units having a space in-between. All the pairs are substantially disk shaped, arranged around a shared central axis. A subject 300, mounted on a cradle 500 is carried by a carrying means not shown in and out of the bore of the magnet system 100.

The main magnetic field magnet sections 102 generate a magnetostatic field in the bore of the magnet system 100. The direction of the magnetostatic field is substantially orthogonal to the bodily axis of the subject 300. Thus a so-called vertical magnetic field is formed. Each main magnetic field magnet section 102 is constituted of, for instance, a permanent magnet. Of course, it may be constituted of a superconductive electromagnet, a conducting electromagnet or the like instead of a permanent magnet.

The gradient coil section 106 generates gradient magnetic fields for providing a gradient to the magnetostatic field. Three kinds of gradient magnetic fields are generated, including slice gradient magnetic fields, read out gradient magnetic fields and phase encode gradient magnetic fields. To match these three kinds of gradient magnetic fields, the gradient coil section 106 has three lines of gradient coils not shown.

The three lines of gradient coils generate three gradient magnetic fields for providing gradients to the magnetostatic field in three mutually orthogonal directions. One of the three directions is the direction of the magnetostatic field (vertical direction), which usually is supposed to be the z direction. Another is the horizontal direction, which usually is supposed to be the y direction. The remaining one is the direction normal to the z and y directions, which usually is supposed to be the x direction. The x direction is normal to the z direction within the vertical plane, and normal to the y direction within the horizontal plane. The x, y and z directions will be hereinafter referred to as gradient axes.

Any of the x, y and z axes can be used as the slice gradient axis. Where any one of them is used as the slice gradient axis, one of the remaining two is used as the phase encode gradient axis, and the other as the read out gradient axis. The three lines of gradient coils will be further described afterwards.

The RF coil section 108 transmits to the magnetostatic field space RF excitation signals for exciting spins within the body of the subject 300. The RF coil section 108 also receives magnetic resonance signals generated by the excited spins. The RF coil section 108 has a coil for transmission and a coil for reception, neither shown. For transmission and reception, either the same coil may be used in common or a separate coil may be dedicated for each purpose.

To the gradient coil section 106 is connected a gradient drive section 130. The gradient drive section 130 gives a drive signal to the gradient coil section 106 to generate gradient magnetic fields. The gradient drive section 130 has three lines of drive circuits respectively corresponding to the three lines of gradient coils in the gradient coil section 106.

To the RF coil section 108 is connected an RF drive section 140. The RF drive section 140 gives a drive signal to the RF coil section 108 to transmit RF excitation signals and thereby to excite spins within the body of the subject 300.

To the RF coil section 108 is also connected a data collecting section 150. The data collecting section 150 takes in receive signals received by the RF coil section 108, and collects them as view data.

A control section 160 is connected to the gradient drive section 130, the RF drive section 140 and the data collecting section 150. The control section 160 accomplishes imaging by controlling the sections from the gradient drive section 130 through the data collecting section 150.

The output side of the data collecting section 150 is connected to a data processing section 170. The data processing section 170 is constituted of, for instance, a computer. The data processing section 170 has a memory not shown. The memory stores programs and various data for the data processing section 170. The functions of this apparatus are realized by the execution of the programs stored in the memory by the data processing section 170.

The data processing section 170 stores into the memory the data taken in from the data collecting section 150. A data space is formed within the memory. The data space constitutes a two-dimensional Fourier space. The data processing section 170 subjects these data in the two-dimensional Fourier space to two-dimensional inverse Fourier transformation to generate (reconstruct) images of the subject 300. The two-dimensional Fourier space is also known as a k-space.

The data processing section 170 is connected to the control section 160. The data processing section 170 is positioned superior to and exercises overall supervision over the control section 160. To the data processing section 170 are also connected a display section 180 and an operating section 190. The display section 180 is constituted of a graphic display or the like. The operating section 190 is constituted of a keyboard or the like provided with a pointing device.

The display section 180 displays reconstructed images and various items of information outputted from the data processing section 170. The operating section 190, operated by an operator, inputs various commands and information to the data processing section 170. The operator operates this apparatus interactively through the display section 180 and the operating section 190.

Figure 2:
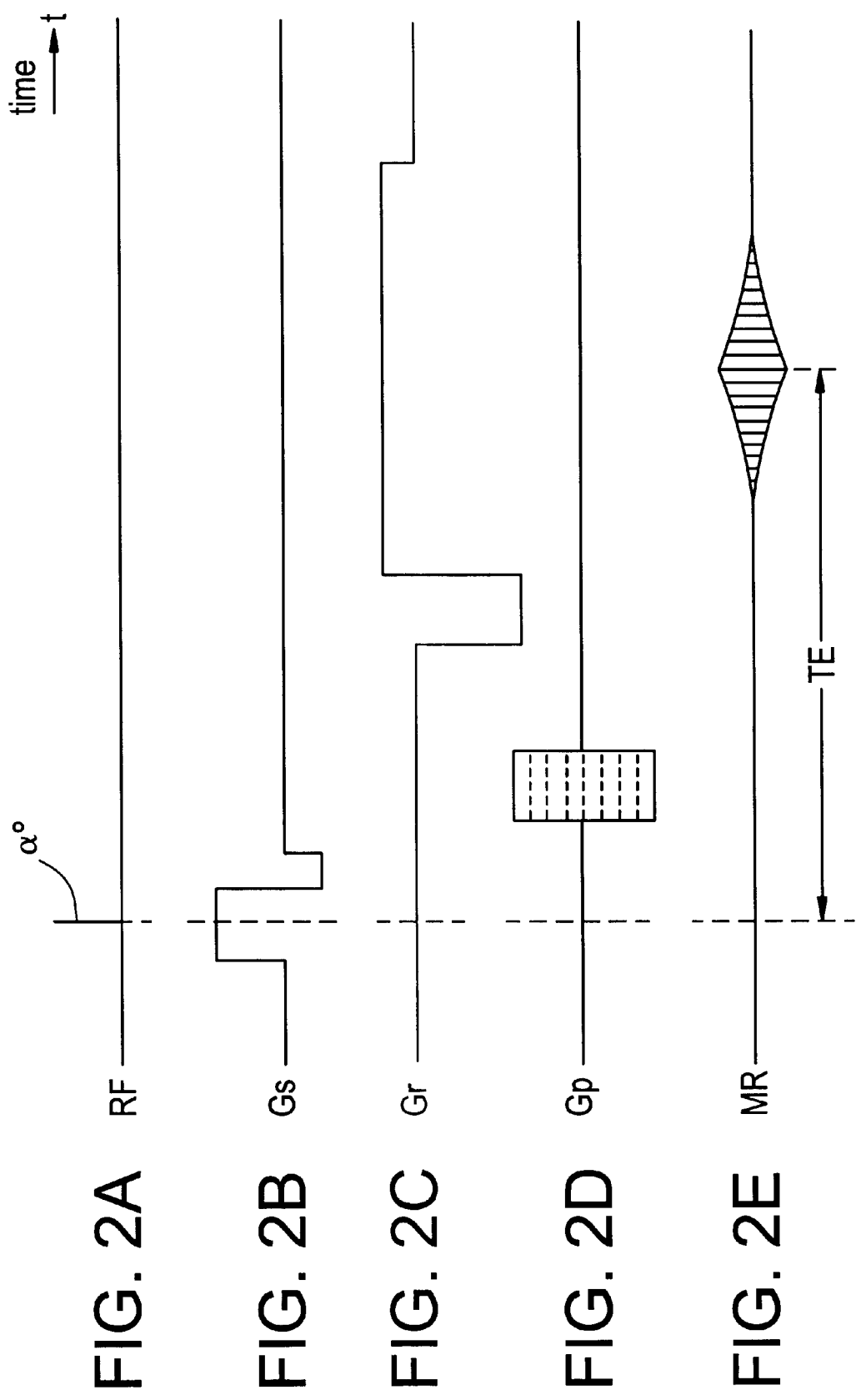
FIG. 2 is a diagram illustrating an example of pulse sequence executed by the apparatus shown in FIG. 1.

FIG. 2 illustrates an example of set of pulse sequences for use in imaging with this apparatus. These pulse sequences are pulse sequences by a gradient echo (GRE) method.

Thus, (1) is an α° pulse sequence for RF excitation in the GRE process, while (2), (3), (4) and (5) are the sequences of the slice gradient Gs, the read out gradient Gr, the phase encode gradient Gp and the gradient echo MR, respectively. Incidentally, the α° pulse is represented by the center signal. The pulse sequences proceed from left to right along a time axis t.

As illustrated in the figure, α° excitation of a spin with the α° pulse is carried out. The flip angle α° is not more than 90°. At this time, the slice gradient Gs is applied to accomplish selective excitation for a prescribed slice.

After the α° excitation, the spin is phase-encoded with the phase encode gradient GP. Next, the spin is first dephased with the read out gradient Gr, and then rephased to generate a gradient echo MR. The signal intensity of the gradient echo MR reaches its maximum at a point of time after the lapse of an echo time TE from the α° excitation. The gradient echo MR is collected from the data collecting section 150 as view data.

Such pulse sequences are repeated 64 to 512 times with a period of TR (repetition time). Every time they are repeated, the phase encode gradient GP is altered to carry out phase encoding in a different way. As a result, view data for 64 to 512 views to fill the k-space are obtained.

Figure 3:
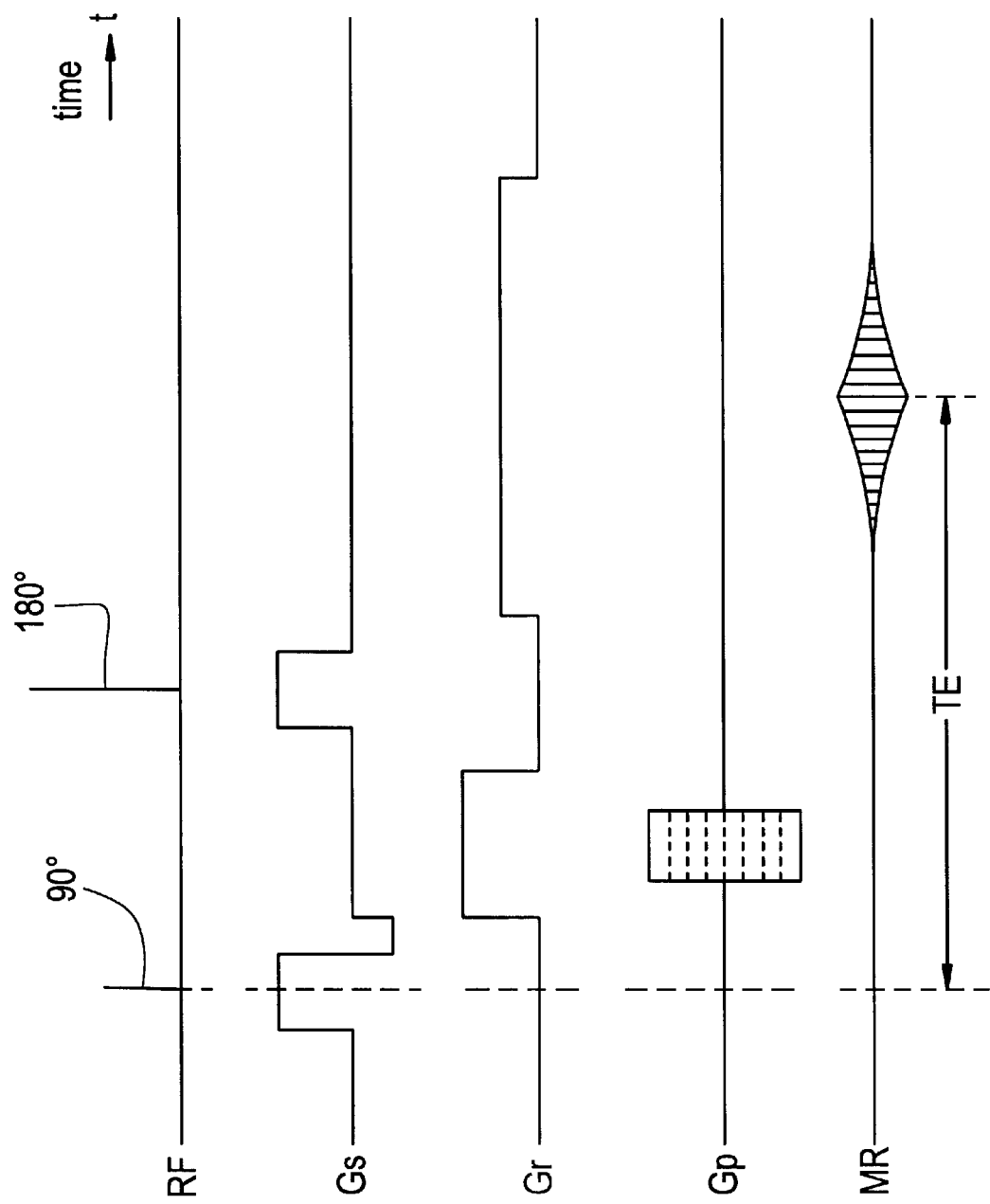
FIG. 3 is another diagram illustrating an example of pulse sequence executed by the apparatus shown in FIG. 1.

Another example of pulse sequences for magnetic resonance imaging is shown in FIG. 3. These pulse sequences are pulse sequences of a spin echo method.

Thus, (1) is a 90° and 180° pulse sequence for RF excitation in the SE process, while (2), (3), (4) and (5) are the sequences of the slice gradient Gs, the read out gradient Gr, the phase encode gradient Gp and the spin echo MR, respectively. Incidentally, the 90° and 180° pulses are represented by the respective center signals. The pulse sequences proceed from left to right along a time axis t.

As illustrated in the figure, 90° excitation of a spin with the 90° pulse is carried out. At this time, the slice gradient Gs is applied to accomplish selective excitation for a prescribed slice. A prescribed length of time after the 90° excitation, 180° excitation with a 180° pulse, i.e. spin inversion, is carried out. At this time again, the slice gradient Gs is applied to accomplish selective inversion for the same slice.

During the period between the 90° excitation and the spin inversion, the read out gradient Gr and the phase encode gradient GP are applied. Spin dephasing is carried out with the read out gradient Gr. Spin phase encoding is accomplished with the phase encode gradient GP.

After the spin inversion, a spin echo MR is generated by rephasing the spin with the read out gradient Gr. The signal intensity of the spin echo MR reaches its maximum at a point of time TE after the 90° excitation. The spin echo MR is collected from the data collecting section 150 as view data. Such pulse sequences are repeated 64 to 512 times with a period of TR (repetition time). Every time they are repeated, the phase encode gradient GP is altered to carry out phase encoding in a different way. As a result, view data for 64 to 512 views to fill the k-space are obtained.

To add, the pulse sequences for use in imaging are not limited to those of the GRE method or the SE method, but those of some other appropriate techniques including a fast spin echo (FSE) method, a fast recovery spin echo (FSE) method and an echo planar imaging (EPI) method may be used instead.

The data processing section 170 reconstructs the sectional images of the subject 300 by subjecting view data in the k-space to two-dimensional inverse Fourier conversion. The reconstructed images are stored in the memory, and displayed on the display section 180.

Figure 4:
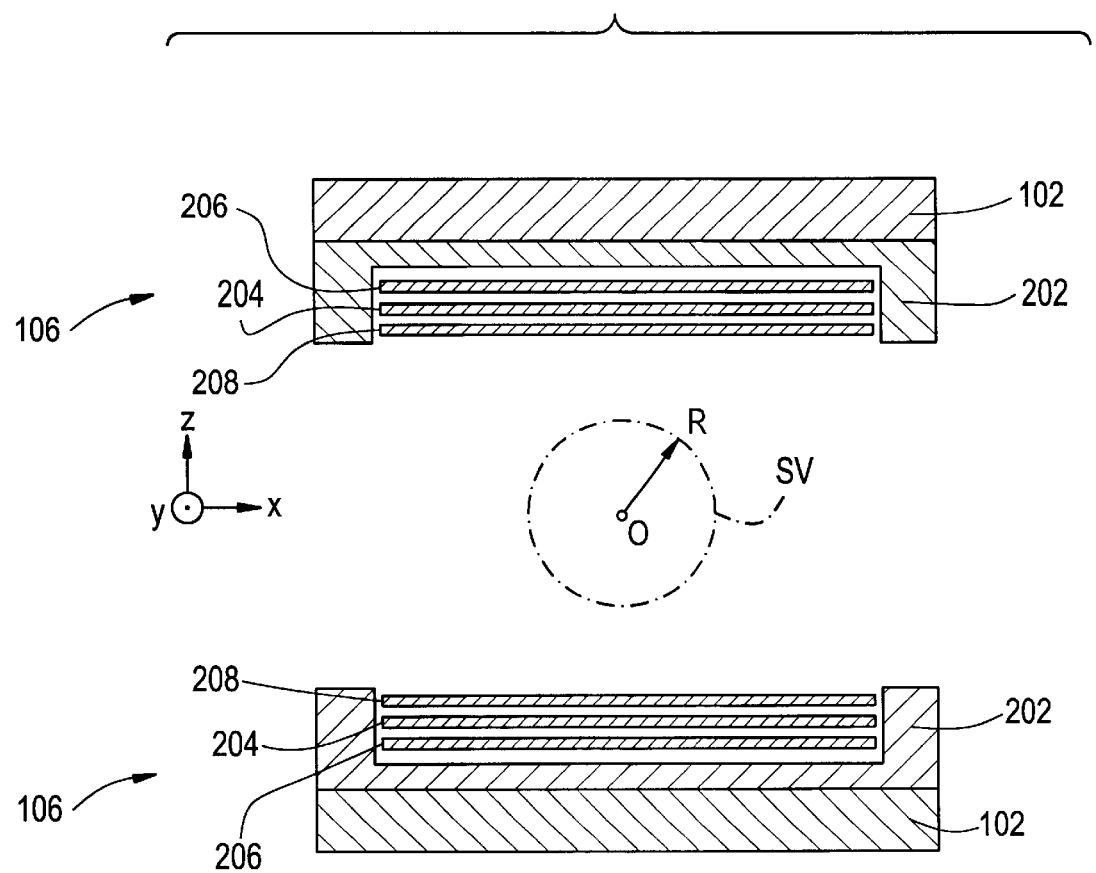
FIG. 4 is a diagram schematically illustrating a section of the structure of the magnet system of the apparatus shown in FIG. 1 in the vicinity of the gradient coil section.

FIG. 4 schematically illustrates a section of the structure of the magnet system 100 in the vicinity of the gradient coil section 106. In the figure, O denotes the center of the magnetostatic field, i.e. the magnet center, and x, y and z denote the aforementioned three directions.

A spheric volume (SV) of a radius R around the magnet center O is the area to be imaged, and the magnet system 100 is so constituted that the magnetostatic field and the gradient magnetic fields have a prescribed level of accuracy in this SV.

The pair of main magnetic field magnet sections 102 have a pair of pole pieces 202 opposite to each other. The pole piece 202 is constituted of a magnetic material having a high permeability, such as soft iron, and serves to uniformize the magnetic flux distribution in the magnetostatic field space.

Each pole piece 202, having a substantially disk shape, has a periphery projecting in a direction normal to the plate surface (the z direction); thus, the pole pieces 202 project toward each other. The projecting parts serve to compensate for a drop in magnetic flux density on the peripheries of the pole pieces 202.

In a concave part, formed within the projecting portion of the periphery, of each pole piece 202, there is provided the gradient coil section 106. The gradient coil section 106 has an X coil 204, a Y coil 206 and a Z coil 208.

Each of the X coil 204, the Y coil 206 and the Z coil 208 is an example of gradient coil in a mode of implementing the invention. The coils, formed in a substantially disk shape, are fitted to the pole face of each pole piece 202 by an appropriate fitting means not shown so as to form layers one over another.

Figure 5:
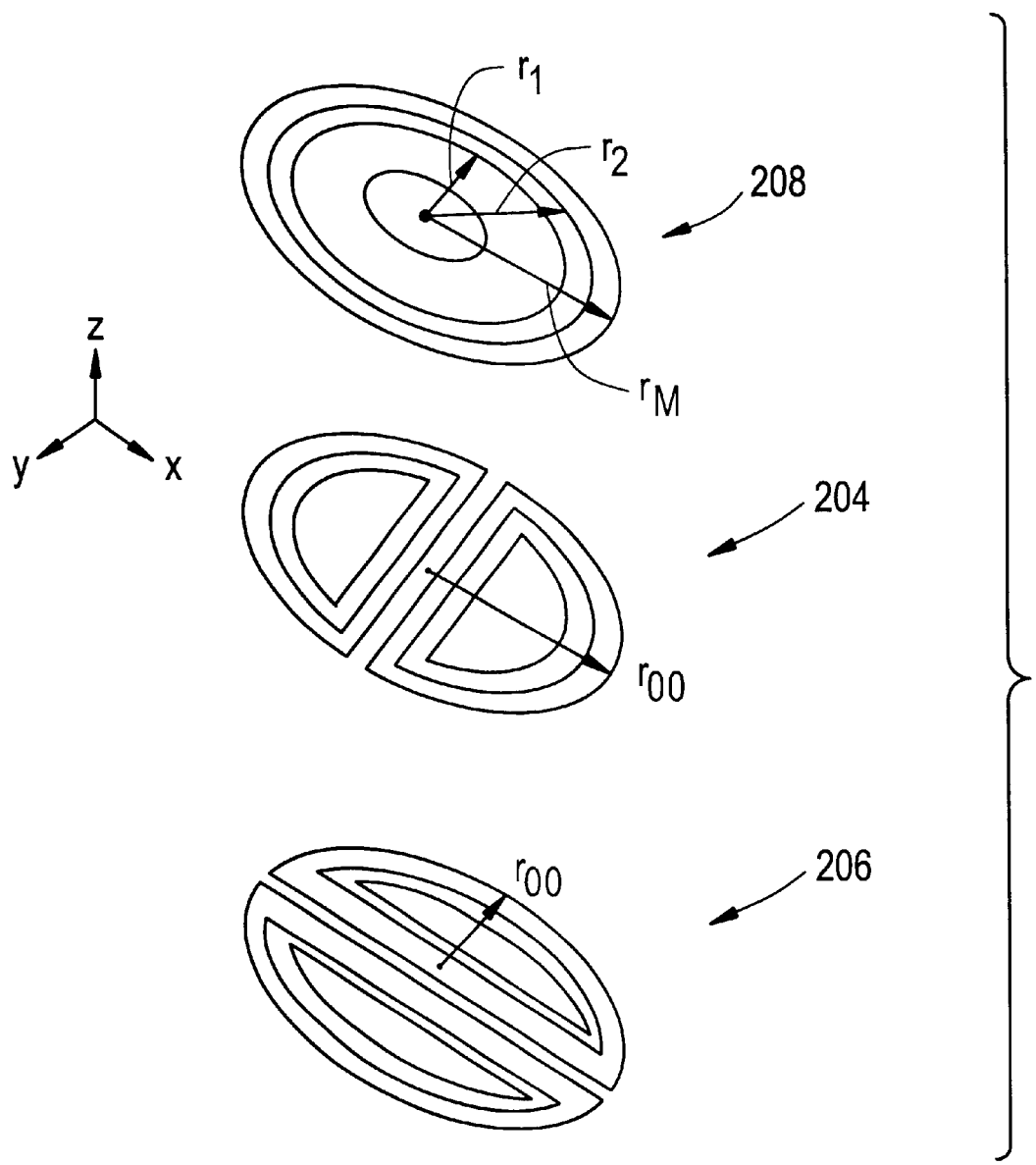
FIG. 5 is a diagram briefly illustrating the patterns of the current passes of gradient coils.

FIG. 5 briefly illustrates the patterns of the current passes of the X coil 204, the Y coil 206 and the Z coil 208. As illustrated in the diagram, the X coil 204 has, in a part near the center of the circle, a plurality of linear main passes parallel to the y direction. These main passes are symmetrical with respect to the y axis passing the center of the circle. The return passes of the main passes are formed along the circumference. The radius of the outermost return pass, i.e. the external radius of the X coil 204, is r00.

The Y coil 206, in a part near the center of the circle, a plurality of linear main passes parallel to the x direction. These main passes are symmetrical with respect to the x axis. The return passes of the main passes are formed along the circumference. The radius of the outermost return pass, i.e. the external radius of the Y coil 206, is r00.

The Z coil 208 has a plurality of current passes constituting coaxial circles. All these current passes are main passes. The radiuses of the main passes are, in the outward order, respectively r1, r2, . . . , rM; rM is the external diameter of the Z coil 208.

Figure 6:
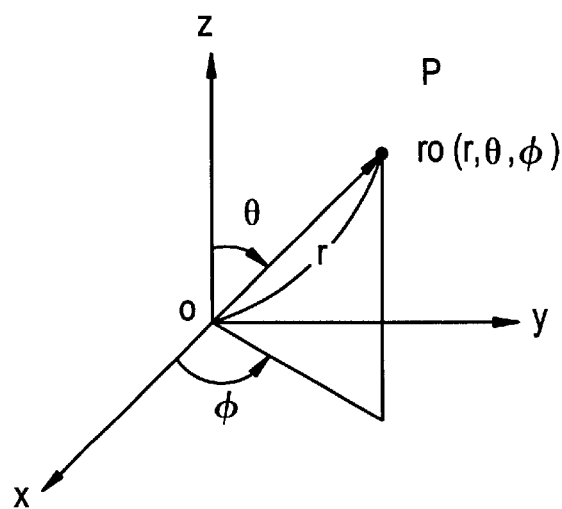
FIG. 6 is a diagram showing three-dimensional coordinates of a measuring point P.

A method to measure the imaging area, i.e. residual magnetic fields in the spheric volume SV in such a magnet system 100 will be described below. First, a plurality of measuring points are set on the surface of the spheric volume SV. To represent a measuring point P by three-dimensional polar coordinates, as shown in FIG. 6, setting of a plurality of measuring points is accomplished by setting a plurality of combinations of angles θ and φ with the radius r being constant. The angle θ corresponds to, so to speak, the latitude, and the angle φ, to the longitude.

Figure 7A:
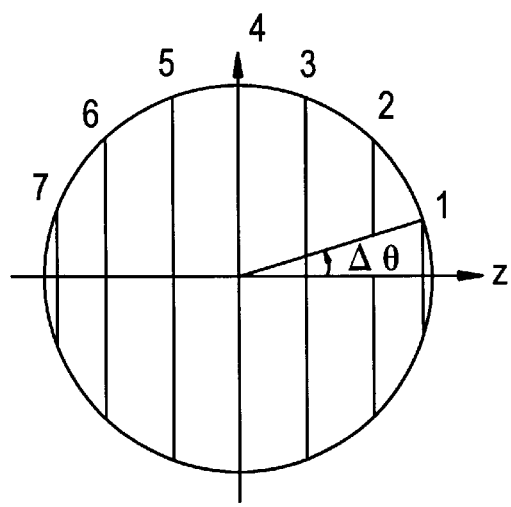
FIG. 7 is a diagram showing longitudes and latitudes of arranging measuring points P on a spheric surface.
Figure 7B:
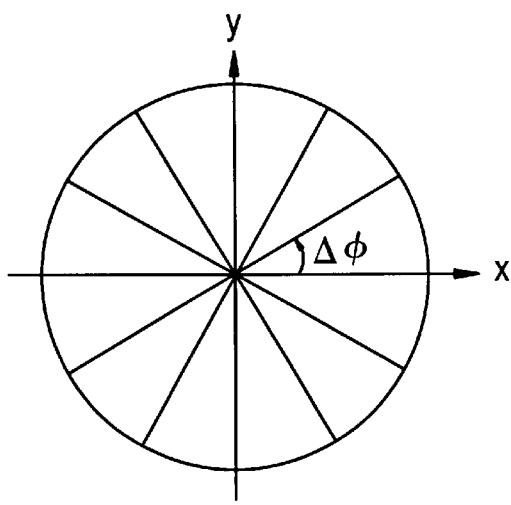

The angle θ, as shown in FIG. 7(a), is set at, for instance, 22.5 degree intervals. Seven latitudes are set thereby. The angle φ, as shown in FIG. 7(b), is set at, for instance, 30 degree intervals. Twelve longitudes are set thereby.

The intersection points between such latitudes and longitudes are used as measuring points P. Therefore, the number of measuring points on the spheric surface is 84. In addition to these measuring points, a measuring point P0 is also set at the magnet center O. The measuring point P0 is for reference. If no reference is required, the measuring point P0 is dispensable.

At each measuring point is installed a probe consisting of a sample for generating magnetic resonance fitted with an RF coil for signal detection. As the sample is used, for instance, an aqueous solution of cupric sulfate ($CuSO_4$), nickel chloride (NiCl) or the like sealed in a small container. The volume of the sample is to be equivalent to one voxel of imaging space.

Such probes, each supported by an appropriate supporting means, are successively positioned for the measuring points to measure the magnetic field at each measuring point on the spheric surface and the magnet center O. At least two probes are used to simultaneously measure the magnetic field at each measuring point on the spheric surface and the magnet center O. If no reference is required, only the measuring points on the spheric surface are measured.

Figure 8:
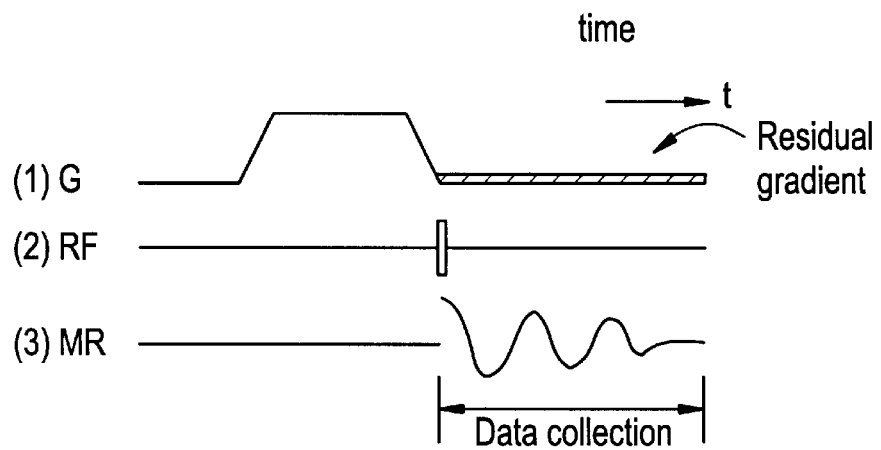
FIG. 8 is a diagram showing pulse sequences for magnetic field measurement.

FIG. 8 illustrates pulse sequences for measuring magnetic fields. In the figure, (1) is the sequence of gradient magnetic fields, (2), the sequence of RF excitation and (3) the sequence of magnetic resonance signals, i.e. FID (free induction decay) signals.

As illustrated in the figure, a gradient magnetic field G is applied to one axis and, after its completion, RF excitation is carried out. On the basis of the RF excitation, the sample in the probe generates an FID signal. This FID signal is received by the RF coil provided for the probe, and received data are collected by the data collecting section 150.

Figure 9:
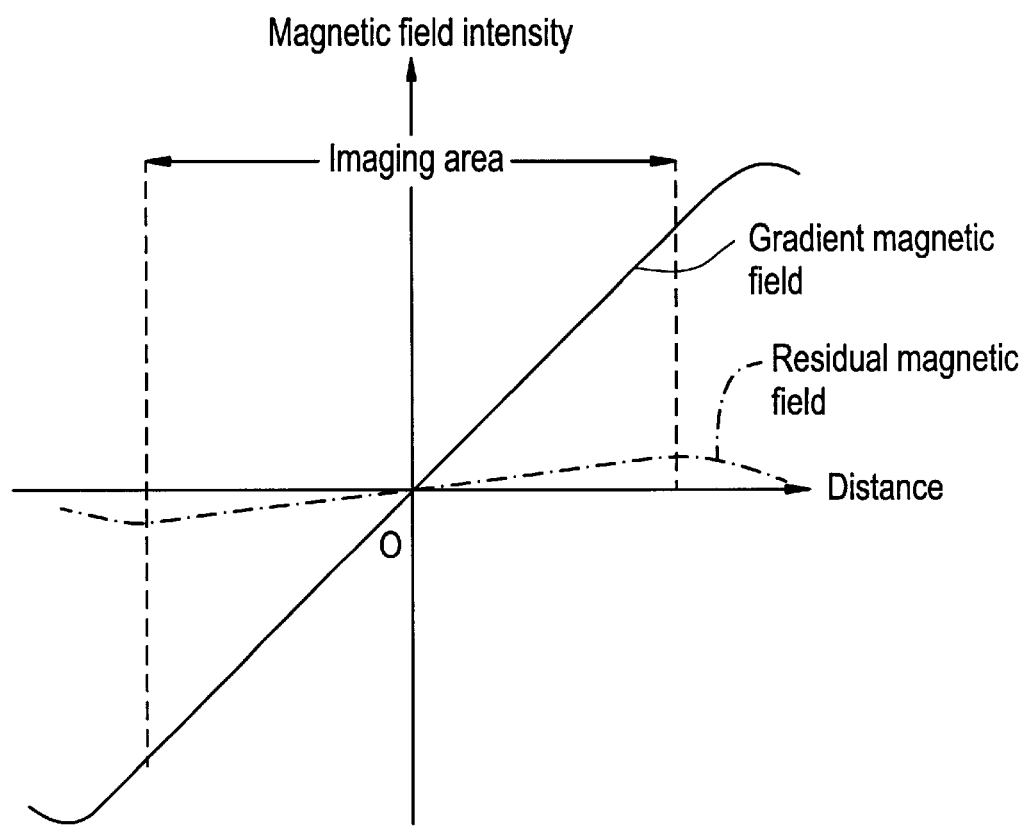
FIG. 9 is a diagram showing the relationship between a gradient magnetic field and a magnetic field.

If the gradient magnetic field G is like, for instance, what is represented by the solid line in FIG. 9, magnetization of the pole piece 202 thereby will leave a residual magnetic field like, for instance, what is represented by the one dot chain line even after the application of the gradient magnetic field is stopped. As represented by the shaded part in FIG. 8, the state looks as if the gradient magnetic field remained.

An FID signal measured under such a residual magnetic field can be represented by the following mathematical expression.

$$S(t) \simeq \rho(r_0)\exp(-j\gamma Grm r_0 t) \quad (1)$$

where $\rho$: spin density $\gamma$: magnetic field rotation ratio

Grm: magnetic field intensity

As shown in Expression (1), the magnetic field intensity Grm affects the phase of the FID signal.

Then, from an FID signal expressed in a complex number, $$S(t) = S_R(t) + jS_I(t) \quad (2)$$

the phase is calculated by $$\phi(t) = \text{Arctan}\left(\frac{S_I(t)}{S_R(t)}\right) \quad (3)$$

and, using its time differential, $$Grm = \frac{1}{\gamma r_0} \cdot \frac{d\phi(t)}{dt} \quad (4)$$

the magnetic field intensity is calculated. The measurement of the magnetic field at the measuring point P is thereby obtained.

In practice, since a magnetostatic field is present in the measuring space, the differential of the phase $\phi 0(t)$ of the FID signal measured at the magnet center O is calculated to obtain the magnetic field intensity.

$$Grm = \frac{1}{\gamma r_0}\left(\frac{d\phi(t)}{dt} - \frac{d\phi_0(t)}{dt}\right) \quad (5)$$

Any measurement error due to intensity fluctuations of the magnetostatic field can be eliminated thereby. The foregoing calculations are carried out by the data processing section 170.

Reflecting the process of gradient magnetic field application, a magnetization hysteresis has arisen in the pole pieces 202. The magnetization hysteresis draws a minor hysteresis loop. In order to measure always under the same conditions what has such a hysteresis, magnetic field measurement is accomplished in the following manner.

Figure 10:
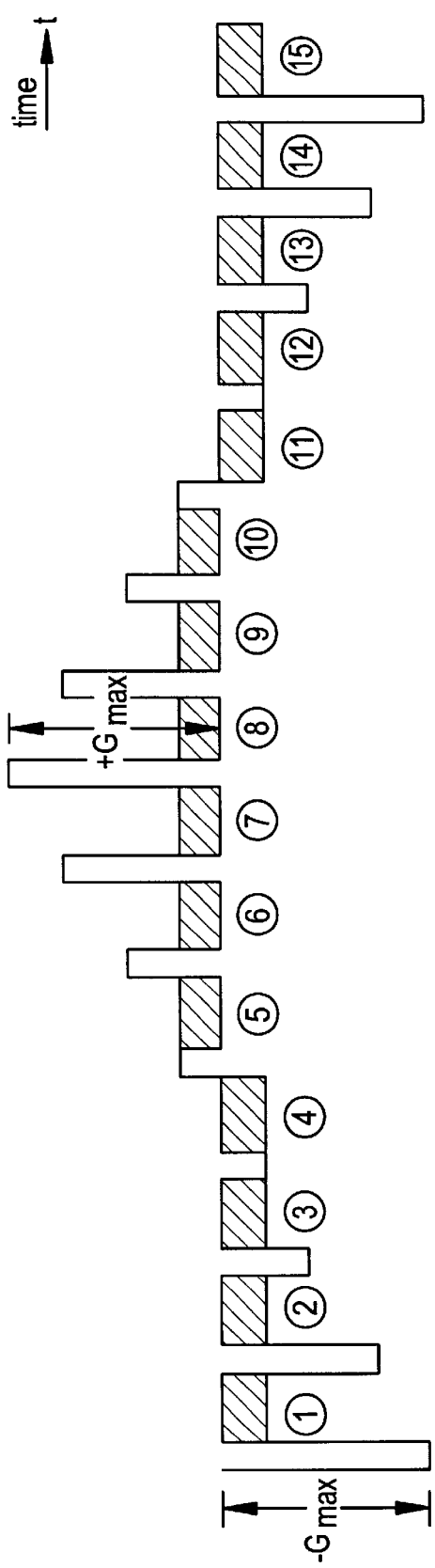
FIG. 10 is a diagram illustrating the sequence of gradient magnetic field application per measuring point at the time of measurement.

FIG. 10 illustrates the sequence of gradient magnetic field application per measuring point at the time of measurement. As illustrated in the diagram, the gradient magnetic field is intermittently applied while its intensity is successively varied. Thus, in the first half of the sequence for instance, it is applied while the intensity is successively varied from −Gmax, the maximum negative gradient that can be generated by this apparatus to +Gmax, the maximum positive gradient, and in the second half it is applied while the intensity is successively varied from +Gmax, the maximum positive gradient to −Gmax, the maximum negative gradient. By varying the intensity of the gradient in a full round in this manner, the magnetized state of the pole pieces 202 can be made the same before and after the start of the sequence.

During the intermittence of gradient application, as conceptually represented by shadowed parts, a gradient magnetic field remains. During these periods, the aforementioned RF excitation and FID measurement are performed every time and, on the basis of the measurement signal at each time, the magnetic field intensity Grm of each is found out as described above. This gives, for instance, 15 magnetic field measurements per measuring point.

Figure 11:
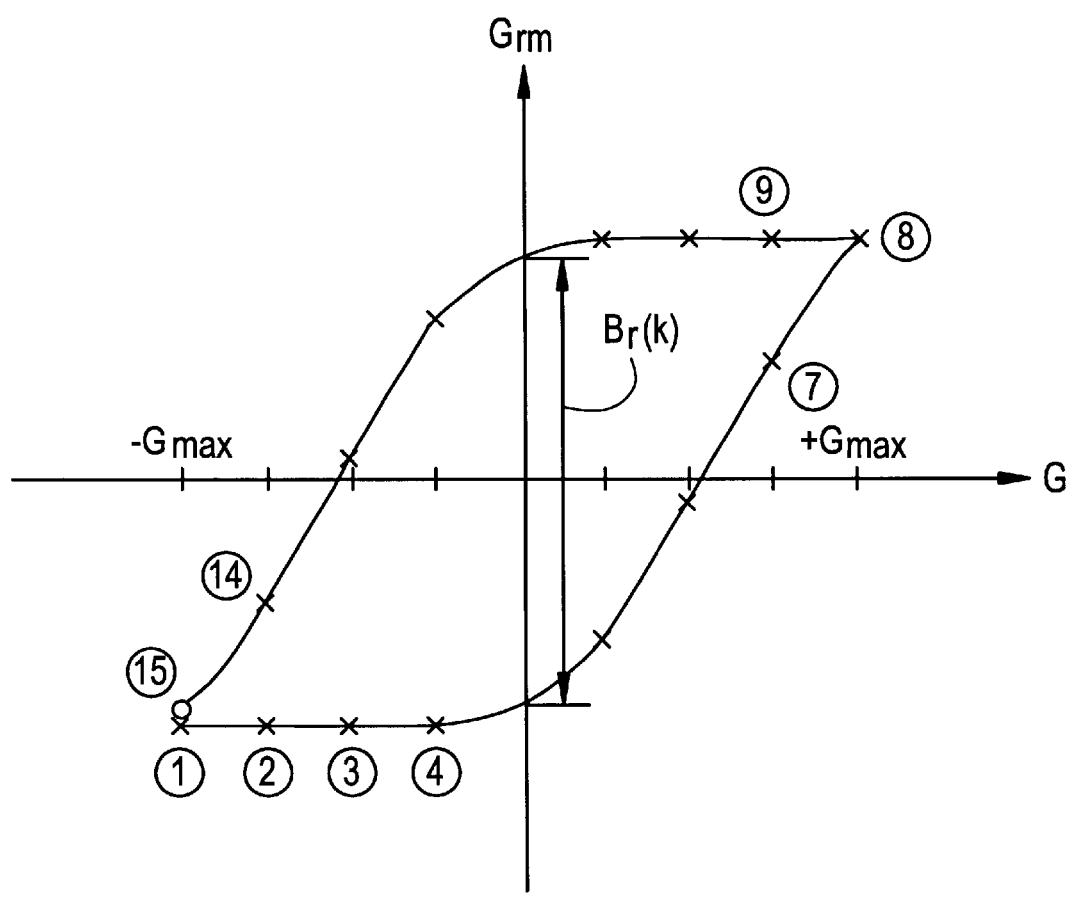
FIG. 11 is a diagram showing the hysteresis of measurements.

By figuring out the correspondence of such a magnetic field measurement to the applied gradient, a hysteresis loop like the one shown in FIG. 11, for instance, is obtained. Then the width of this hysteresis loop in the direction of the Grm axis, i.e. the difference between values at two points on the Grm axis where the hysteresis loop crosses is supposed to be the magnetic field intensity Br(k) of the measuring point P.

By fitting the magnetic field measurements obtained at the 84 measuring points P in this manner into the spheric surface function to calculate the space component of the residual magnetic field. The fitting is accomplished by the data processing section 170. Hereinafter, the magnetic field measurement may be referred to as simply the measurement.

An expanded expression of the spheric surface function is given by the following mathematical expression.

$$B_z = \sum_{n=1}^{\infty} \sum_{m=0}^{\infty} r^n P_n^m(\cos\theta)(A_n^m \cos m\phi + B_n^m \sin m\phi) \text{ where} \quad (6)$$

$P_n^m$ is Legendre's associated function, $A_n^m$, $B_n^m$ are constants.

Fitting is accomplished, for instance, in the following manner.

1. Where m=0:

In this case, mathematical expression (6) will be transformed into:

$$B_z = \sum_{n=1}^{\infty} C_n r^n P_n(\cos\theta) \quad (7)$$

$$= C_1 r P_1(\cos\theta) + C_2 r^2 P_2(\cos\theta) + C_3 r^3 P_3(\cos\theta) + \ldots$$

Where measurements at measuring points differing in z coordinate are:

$B_{r1}, B_{r2}, \ldots, B_{rN}$ the following equation will hold.

$$\begin{bmatrix} rP_1(\cos\theta_1)r^2P_2(\cos\theta_1) & \ldots & r^lP_l(\cos\theta_1) \\ rP_1(\cos\theta_2)r^2P_2(\cos\theta_2) & \ldots & r^lP_l(\cos\theta_2) \\ \vdots & & \\ rP_1(\cos\theta_N)r^2P_2(\cos\theta_N) & \ldots & r^lP_l(\cos\theta_N) \end{bmatrix} \begin{bmatrix} C_1 \\ C_2 \\ \vdots \\ C_l \end{bmatrix} = \begin{bmatrix} B_{r1} \\ B_{r2} \\ B_{r3} \\ \vdots \\ B_{rN} \end{bmatrix} \quad (8)$$

By solving this equation, $C_1, C_2, \ldots, C_l$ components are obtained. They are usually known as $Z_1, Z_2, \ldots, Z_l$ components.

2. Where m≠0:

Where m=1 for instance, mathematical expression (6) will be transformed into:

$$Bz_{m=1} = \sum_{n=1}^{\infty} P_n^1(\cos\theta)(A_n^1 \cos\phi + B_n^1 \sin\phi) \quad (9)$$

If a measurement in a certain xy plane on the spheric surface is represented by:

$B_{r1k}$ the measurement at a measuring point on the circumference will be:

$B_{r1,1}, B_{r1,2}, B_{r1,3}, \ldots B_{r1,12}$ where $$\sum_{k=1}^{M} B_{r1,k} \cos k\Delta\phi = \sum_{n=1}^{\infty} r^n P_n^1(\cos\theta_1)(A_n^1 \cos\Delta\phi + B_n^1 \sin\Delta\phi)\cos\Delta\phi + \quad (10)$$

$$\sum_{n=1}^{\infty} r^n P_n^1(\cos\theta_1)(A_n^1 \cos 2\Delta\phi + B_n^1 \sin 2\Delta\phi)\cos 2\Delta\phi \ldots +$$

$$\sum_{n=1}^{\infty} r^n P_n^1(\cos\theta_1)(A_n^1 \cos M\Delta\phi + B_n^1 \sin M\Delta\phi)\cos M\Delta\phi \stackrel{\Delta}{=} B_{rrl}$$

$$B_{rrl} = \frac{M}{2} \sum_{n=1}^{\infty} r^n P_n^1(\cos\theta) \cdot A_n^1 \quad (11)$$

If, with respect to each xy plane:

$B_{rrl}$ is calculated, the following equation will hold.

$$\begin{bmatrix} rP_1(\cos\theta_1)r^2P_2^1(\cos\theta_1) & \ldots & r^lP_l^1(\cos\theta_1) \\ rP_1(\cos\theta_2)r^2P_2^1(\cos\theta_2) & \ldots & r^lP_l^1(\cos\theta_2) \\ \vdots & & \\ rP_1(\cos\theta_N)r^2P_2^1(\cos\theta_N) & \ldots & r^lP_l^1(\cos\theta_N) \end{bmatrix} \begin{bmatrix} A_1^1 \\ A_2^1 \\ \vdots \\ A_l^1 \end{bmatrix} = \begin{bmatrix} B_{rr1} \\ B_{rr2} \\ B_{rr3} \\ \vdots \\ B_{rrN} \end{bmatrix} \quad (12)$$

By solving this equation:

$A_1^1, A_2^1, \ldots, A_l^1$ are obtained. They are usually known as $ZX, Z^2X, \ldots$ 3. Where m=2:

In this case, if in mathematical expression (10)

$$\sum_{k=1}^{M} B_{r1,k} \cos 2 \cdot k\Delta\phi$$

is supposed, similarly $$A_n^2$$

Thus $ZX^2, Z^2Z^2, \ldots$ can be figured out.

Figure 12:
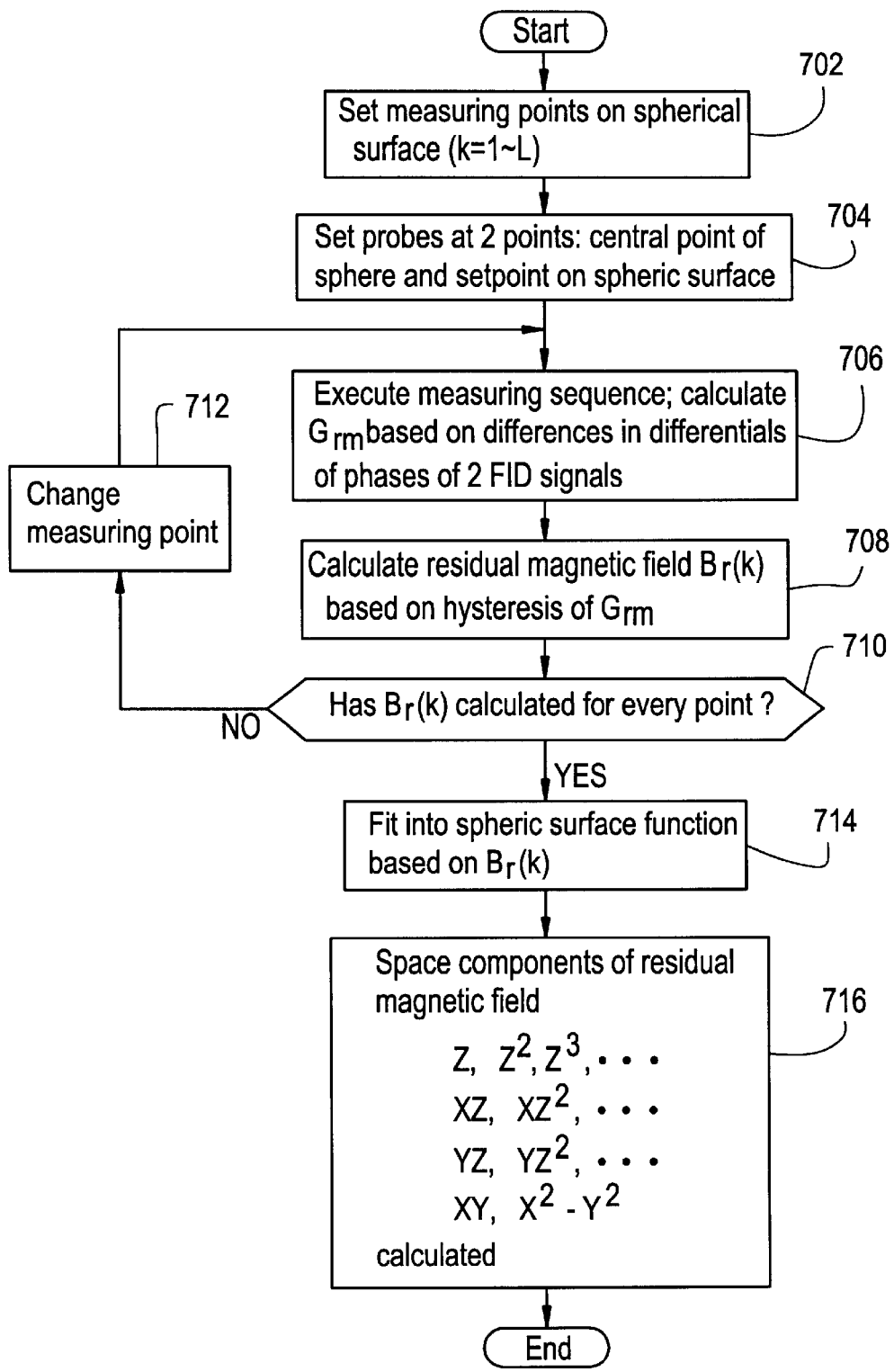
FIG. 12 is a flow chart showing the procedure of magnetic field measurement and function fitting.

FIG. 12 shows a flow chart of magnetic field measurement at a plurality of measuring points as described above and fitting into the spheric surface function on that basis.

As shown in the chart, measuring points on the spherical surface are set at step 702. The measuring points are set in the manner described above. There are L measuring points.

Next at step 704, probes are set, one each at the center or the sphere, i.e. the magnet center O, and at one measuring point on the spherical surface.

Then at step 706, a measuring sequence as shown in FIG. 10 is executed to measure the FID signals of the two probes, and the magnetic field measurement Grm is calculated on the basis of the difference between the differentials of their phases.

Next at step 708, a residual magnetic field Br(k) is calculated on the basis of the hysteresis of Grm as shown in FIG. 11.

Then at step 710, it is determined whether or not the residual magnetic field Br(k) has been calculated for every measuring point and, if not, the measuring point is altered at step 712 to repeat the operations at steps 706 and 708.

If the residual magnetic field Br(k) has been calculated for every measuring point, Br(k) is fitted into the spheric surface function at step 714. As a result, at step 716, the space components of residual magnetic fields:

$Z, Z^2, Z^3, \ldots$ $XZ, XZ^2, \ldots$ $YZ, YZ^2, \ldots$ $XY, X^2-Y^2$, are obtained.

Since these space components of residual magnetic fields are items representing the spheric volume SV, i.e. the characteristics of the residual magnetic fields in the imaging space, this result means that the characteristics of the residual magnetic fields of the magnet system 100 have been successfully analyzed and measured by the above-described measurement and function fitting.

Then, if such analytical results are caused to be reflected in the design of gradient coils, the characteristics of the residual magnetic fields of the magnet system 100 can be improved.

Figure 13:
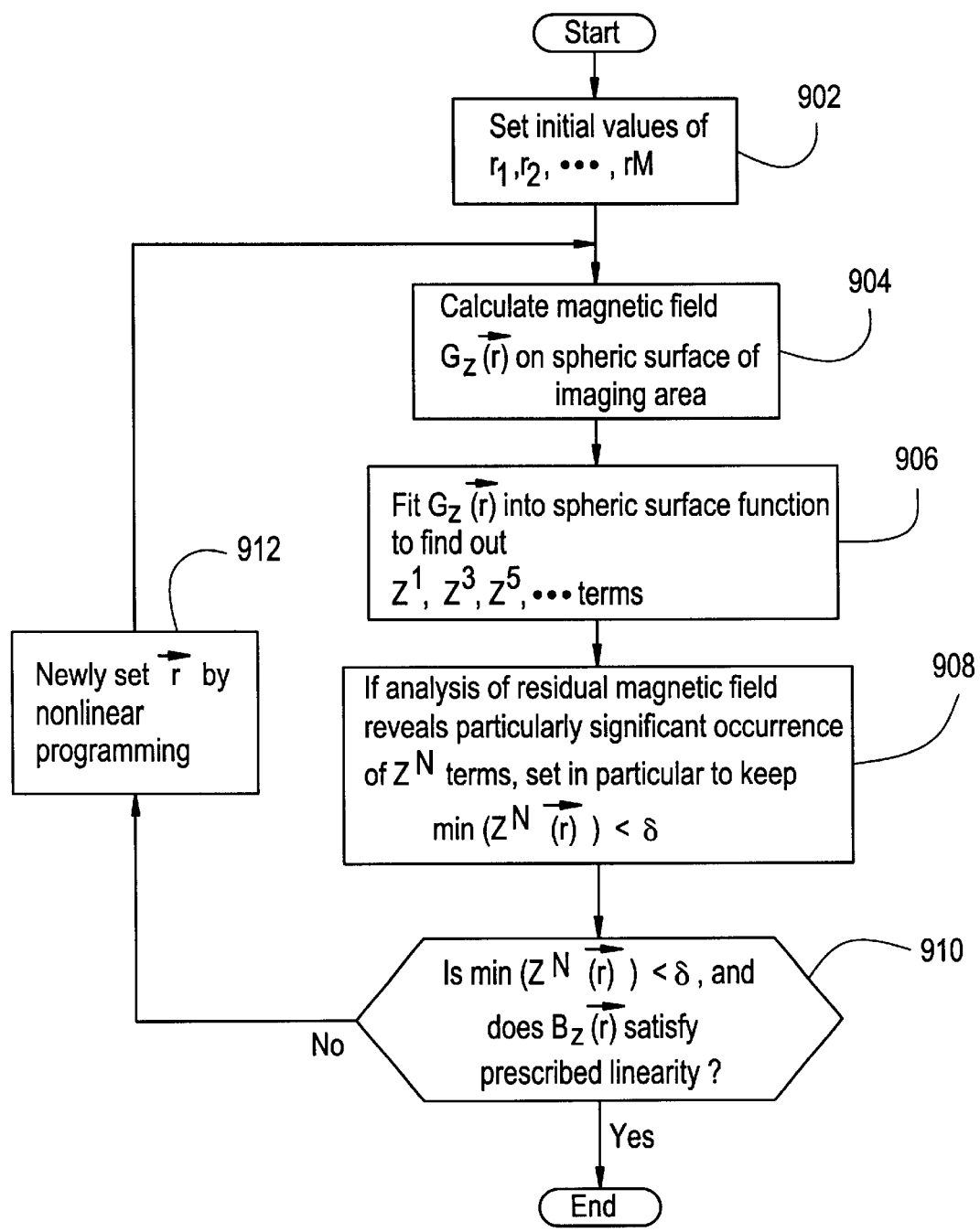
FIG. 13 is a flow chart showing the procedure of gradient coil designing.

FIG. 13 is a flow chart showing an example of the procedure of gradient coil designing, which reflects the result of residual magnetic field analysis. Here is shown the designing procedure for the Z coil.

As shown in the chart, the initial values of the radiuses r1, r2, . . . , rM of the current passes of the Z coil are set at step 902.

Next at step 904, the magnetic field (magnetic field intensity) which the Z coil having the aforementioned initial values generates on the spheric surface of the imaging area:

$$G_Z(\vec{r})$$

where $$\vec{r} = (r1, r2, \ldots, r_M)$$

is calculated. Calculation of the magnetic field uses Biot-Savart's law.

Then by fitting the magnetic field mentioned above into the spheric surface function at step 906, the $$Z, Z^3, Z^5, \cdots$$

terms are figured out.

Next at step 908, where the above-described analysis of residual magnetic fields has revealed, in particular, that the $$Z^N$$

term is greater, to make $$\min(Z^N(\vec{r})) < \delta$$

hold true, $$\vec{r}$$

is adjusted, where δ is an allowance.

Then at step 910, it is determined whether or not the magnetic field generated by the Z coil satisfying the above-stated conditions and adjusted to satisfy them satisfies a prescribed degree of linearity.

If it does not, at step 912, by a nonlinear programming method $$\vec{r}$$

is newly set, and the processing from step 904 onward is repeated.

If it does satisfy them, the values of r1, r2, . . . , rM are finalized. And a Z coil having electric passes of such radiuses is produced. A magnet system 100 equipped with such a Z coil will be improved in residual magnetic field characteristics. Therefore, an apparatus for magnetic resonance imaging using such a magnet system can produce high quality images little affected by residual magnetic fields.

Many widely different embodiments of the invention may be configured without departing from the spirit and the scope of the present invention. It should be understood that the present invention is not limited to the specific embodiments described in the specification, except as defined in the appended claims.

What is claimed:

1. A method of measuring magnetic fields, comprising the steps of:
   arranging a magnetically resonant sample at a measuring point on a surface of an imaginary sphere in a measuring space;
   applying intermittently a gradient magnetic field while a gradient is successively varied from a maximum gradient in one polarity to a maximum gradient in a reverse polarity and then said gradient is successively varied from a maximum gradient in said reverse polarity to a maximum in said first polarity;
   carrying out RF excitation during intermittence of said gradient magnetic field to measure FID signals generated by said sample;
   calculating differentials of phases of said FID signals;
   calculating a magnetic field intensity at said measuring point on basis of hysteresis of differences in said differentials accompanying completion of said round of gradients; and
   fitting said magnetic field intensity into a spherical surface function representing a magnetic field intensity distribution in said measuring space.

2. The method of claim 1, wherein said measuring is accomplished at a plurality of measuring points.

3. The method of claim 1, further comprising the step of arranging another magnetically resonant sample at a center of said sphere, and wherein said calculating differentials comprises calculating differences in differentials of phases of FID signals generated by samples at said measuring point and at said center of said sphere.

4. The method of claim 3, wherein said measuring is consecutively accomplished at a plurality of points.

5. A method of measuring magnetic fields, comprising the steps of:
   arranging a magnetically resonant sample at a measuring point on a surface of an imaginary sphere in a measuring space;
   applying a gradient magnetic field to said measuring space;
   carrying out RF excitation after stopping application of said gradient magnetic field to measure FID signals generated by said sample;
   calculating a magnetic field intensity at said measuring point on basis of differentials of phases of said FID signals;
   fitting said magnetic field intensity into a spheric surface function representing a magnetic field intensity distribution in said measuring space; and
   arranging another magnetically resonant sample at a center of said sphere; and wherein
   said calculating magnetic field intensity is on basis of difference in differentials of said phases of said FID signals generated by samples at said measuring point and at said center of said sphere.

6. The method of claim 5, wherein said measuring is consecutively accomplished at a plurality measuring points.

7. A method of measuring magnetic fields, comprising the steps of:
   arranging a first magnetically resonant sample on a surface of an imaginary sphere in a measuring space and a second magnetically resonant sample at a different point relative to said first sample;
   applying a gradient magnetic field to said measuring space;
   carrying out RF excitation after stopping application of said gradient magnetic field to measure FID signals generated by said first and second samples; and
   fitting said magnetic field intensity into a spheric surface function representing a magnetic field intensity distribution in said measuring space.

8. The method of claim 7, wherein said measuring is consecutively accomplished at a plurality of measuring points.

9. A method of producing gradient coils, comprising the steps of:

calculating magnetic fields to be generated by a first gradient coil on a surface of an imaginary sphere in a space and a second gradient coil at a point different from that occupied by said first gradient coil;

fitting said magnetic fields into a spheric surface function; and determining current pass of said first and second gradient coils so as to keep small a high order term corresponding to highest order term in said spheric surface function into which said fitting is carried out and representing said calculated magnetic field measurement.

10. Gradient coils for generating gradient magnetic fields with a current flowing through a current pass, said current pass being determined by calculating magnetic fields to be generated by a first gradient coil on a surface of an imaginary sphere in a space and a second gradient coil disposed at a different position;

fitting said magnetic fields into a spheric surface function; and determining said current pass of said first and second gradient coils so as to keep small a high order term corresponding to highest order term in said spheric surface function into which said fitting is carried out and representing said calculated magnetic field measurement.

11. A magnetic resonance imaging apparatus comprising: means for providing a magnetostatic field; means for providing gradient magnetic fields; and means for providing high frequency magnetic fields; wherein said means for providing gradient magnetic fields comprises gradient coils comprising a current pass, said current pass being determined by calculating magnetic fields to be generated by a first gradient coil disposed on a surface of an imaginary sphere and a second gradient coil disposed in a different position;

fitting said magnetic fields into a spheric surface function; and determining said current pass of said first and second gradient coils so as to keep small a high order term corresponding to highest order term in said spheric surface function into which said fitting is carried out and representing said calculated magnetic field measurement.

* * * * *